(12) United States Patent
Lee

(10) Patent No.: US 9,076,677 B2
(45) Date of Patent: Jul. 7, 2015

(54) METHOD FOR FABRICATING SEMICONDUCTOR DEVICE WITH SUPER JUNCTION STRUCTURE

(71) Applicant: Vanguard International Semiconductor Corporation, Hsinchu (TW)

(72) Inventor: Tsung-Hsiung Lee, Taoyuan County (TW)

(73) Assignee: Vanguard International Semiconductor Corporation, Hsinchu (TW)

( * ) Notice: Subject to any disclaimer, the term of this patent is extended or adjusted under 35 U.S.C. 154(b) by 0 days.

(21) Appl. No.: 14/515,545

(22) Filed: Oct. 16, 2014

(65) Prior Publication Data

US 2015/0056771 A1    Feb. 26, 2015

Related U.S. Application Data

(62) Division of application No. 13/364,142, filed on Feb. 1, 2012, now Pat. No. 8,901,641.

(51) Int. Cl.
| | |
|---|---|
| *H01L 29/04* | (2006.01) |
| *H01L 29/10* | (2006.01) |
| *H01L 21/225* | (2006.01) |
| *H01L 29/66* | (2006.01) |
| *H01L 29/78* | (2006.01) |
| *H01L 29/06* | (2006.01) |
| *H01L 21/02* | (2006.01) |
| *H01L 21/265* | (2006.01) |

(52) U.S. Cl.
CPC ........ *H01L 29/1045* (2013.01); *H01L 21/2257* (2013.01); *H01L 29/66727* (2013.01); *H01L 29/7802* (2013.01); *H01L 29/04* (2013.01); *H01L 29/0634* (2013.01); *H01L 29/1095* (2013.01); *H01L 21/02532* (2013.01); *H01L 21/02595* (2013.01); *H01L 21/02634* (2013.01); *H01L 21/26513* (2013.01); *H01L 29/66712* (2013.01)

(58) Field of Classification Search
CPC .................... H01L 21/2257; H01L 21/26513; H01L 29/04; H01L 29/1045; H01L 29/66727
See application file for complete search history.

(56) References Cited

U.S. PATENT DOCUMENTS

| | | | |
|---|---|---|---|
| 2011/0062489 A1* | 3/2011 | Disney et al. ................. | 257/140 |
| 2011/0298042 A1* | 12/2011 | Tu ................................. | 257/330 |
| 2014/0117436 A1* | 5/2014 | Lee et al. ...................... | 257/329 |

* cited by examiner

*Primary Examiner* — Minh-Loan Tran
*Assistant Examiner* — Fazli Erdem

(57) ABSTRACT

A semiconductor device with a super-junction structure is provided, including: a semiconductor substrate having a first conductivity type; an epitaxial layer having the first conductivity type formed over the semiconductor substrate; a first doping region having the first conductive type formed in a portion of the epitaxial layer; a second doping region having a second conductivity type formed in a portion of the of the epitaxial layer; a third doping region having the second conductivity type formed in a portion of the of the epitaxial layer, wherein the doping region partially comprises doped polysilicon materials having the second conductivity type; a gate dielectric layer formed over the epitaxial layer, partially overlying the well region; and a gate electrode formed over a portion of the gate dielectric layer.

13 Claims, 6 Drawing Sheets

METHOD FOR FABRICATING SEMICONDUCTOR DEVICE WITH SUPER JUNCTION STRUCTURE

This application is a divisional of U.S. application Ser. No. 13/364,142, filed Feb. 1, 2012, the entire disclosure of which is hereby incorporated by reference.

BACKGROUND OF THE INVENTION

1. Field of the Invention

The present invention relates to semiconductor fabrication, in particularly to a semiconductor device with a super junction structure and a method for fabricating the same.

2. Description of the Related Art

A vertical double diffused metal-oxide-semiconductor field effect transistor (VDMOSFET) conventionally comprises a P-N junction formed by an N-type epitaxial drift region and a p-type base doping region overlying the N-type epitaxial drift region. A withstand voltage capacity of the VDMOSFET is determined by a maximum voltage which is sustained by the P-N junction. For high voltage VDMOSFET semiconductor device, a doping concentration of the N-type epitaxial drift region is needed to be reduced and a thickness of the N-type epitaxial draft region is needed to be increased. The above methods for improving the withstand voltage capacity of the semiconductor device correspondingly increase an on-state resistance (Ron) of the semiconductor device. The on-state resistance (Ron), however, is limited by the doping concentration and the thickness of the N-type epitaxial drift region. Therefore, a VDMOSFET having a super-junction structure can thus increase a doping concentration of the N-type epitaxial drift region and reduce an on-state resistance (Ron) of the VDMOSFET at the same time.

Conventionally, a disclosed multi-epi technology (i.e. COOLMOS™) is applied for fabricating the super-junction structure. The multi-epi technology comprises the repeating of processing steps including forming an epitaxial layer, implanting P-type dopants into the epitaxial layer, and diffusing the P-type dopants in the epitaxial layer for several times to form the super-junction structure. Thus, the multi-epi technology has disadvantages such as many fabrication steps and high fabrication costs, and a size of the semiconductor device comprising the super-junction structure formed by the conventional multi-epi technology cannot be reduced easily.

BRIEF SUMMARY OF THE INVENTION

Therefore, a semiconductor device with an improved super-junction structure and a method for fabricating the same are needed for solving the above drawbacks.

An exemplary semiconductor device with a super-junction structure is provided, comprising: a semiconductor substrate having a first conductivity type; an epitaxial layer having the first conductivity type formed over the semiconductor substrate; a first doping region having the first conductive type formed in a portion of the epitaxial layer; a second doping region having a second conductivity type formed in a portion of the of the epitaxial layer; a third doping region having the second conductivity type formed in a portion of the of the epitaxial layer, wherein the doping region partially comprises doped polysilicon materials having the second conductivity type; a gate dielectric layer formed over the epitaxial layer, partially overlying the well region; and a gate electrode formed over a portion of the gate dielectric layer.

An exemplary method for fabricating a semiconductor device with a super-junction structure is provided, comprising the following steps: (a) providing a semiconductor substrate having a first conductivity type; (b) forming an epitaxial layer having the first conductivity type over the semiconductor substrate; (c) forming a gate dielectric layer over the epitaxial layer; (d) forming a gate electrode over a portion of the gate dielectric layer; (e) forming a first doping region having the first conductive type in a portion of the epitaxial layer; (f) forming an opening in a portion of the gate dielectric layer and the epitaxial layer; (g) forming a undoped polysilicon layer in the opening; (h) performing an implanting process, implanting dopants of a second conductivity type in the undoped polysilicon layer, thereby forming a doped polysilicon layer having the second conductivity type in the opening; (i) forming a second doping region having a second conductive type in a portion of the epitaxial layer adjacent to the first doping region and the opening; and (j) performing a thermal process to diffuse the dopants in the doped polysilicon layer into the epitaxial layer adjacent thereto, thereby forming a third doping region having the second conductivity type in the epitaxial layer.

An exemplary method for fabricating a super-junction structure is provided, comprising the following steps: (a) providing a semiconductor substrate having a first conductivity type; (b) forming an epitaxial layer having the first conductivity type over the semiconductor substrate; (c) forming an opening in a portion of the epitaxial layer; (d) forming a polysilicon layer having a second conductivity type in the opening; (e) performing an implanting process, implanting dopants of the second conductivity type in the polysilicon layer, thereby forming a doped polysilicon layer having the second conductivity type in the opening; and (f) performing a thermal process to diffuse the dopants in the doped polysilicon layer into the epitaxial layer adjacent thereto, thereby forming a doping region having the second conductivity type in the epitaxial layer.

A detailed description is given in the following embodiments with reference to the accompanying drawings.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

FIGS. 1-10 are cross sections showing an exemplary method for fabricating a semiconductor device with a super-junction structure. The semiconductor device with the super-junction structure shown in FIGS. 1-10 can be, for example, a vertical double diffused metal-oxide-semiconductor field effect transistor (VDMOSFET).

Figure 1:
FIGS. 1-10 are cross sections showing a method for fabricating a semiconductor device with a super-junction structure according to an embodiment of the invention.

In FIG. 1, a semiconductor substrate 100 having a first conductivity type is first provided. Next, an epitaxial growing process (not shown) is performed and an epitaxial layer 102 is formed over the semiconductor substrate 100. In one embodiment, the semiconductor substrate 100 and the epitaxial layer 102 comprise the same conductivity type, and a doping concentration in the semiconductor substrate 100 higher than that in the epitaxial layer 102. Thus, the semiconductor substrate 100 can be, for example, a heavily doped N type (N+) semiconductor substrate, and the epitaxial layer 102 can be, for example, a lightly doped N type (N−) epitaxial layer.

Figure 2:
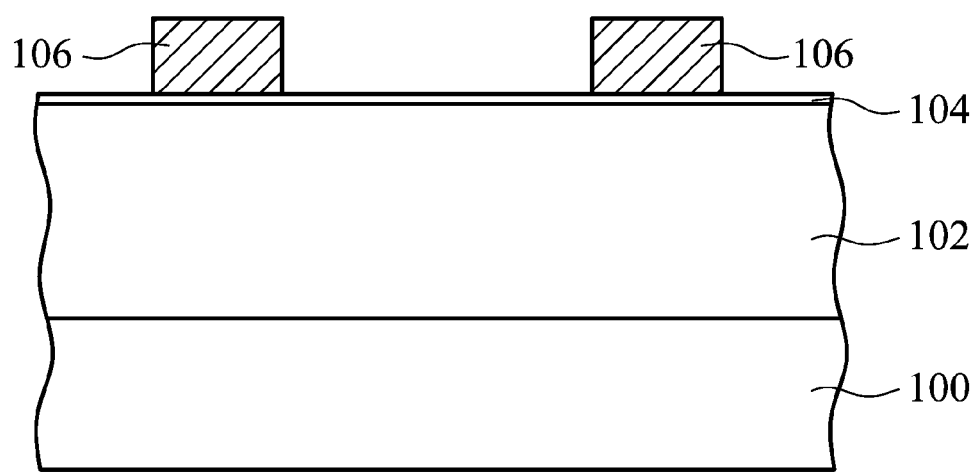

In FIG. 2, a gate dielectric layer 104 and a layer of conductive material (not shown) are blanketly formed over the epitaxial layer 102. The layer of conductive material is then patterned by an etching process (both not shown) incorporating a patterned photoresist mask (not shown). Thus, a plurality of gate electrodes 106 are respectively formed over a portion of the gate dielectric layer 104. In one embodiment, the gate dielectric layer 104 can be formed by a process such as thermal oxidation, chemical vapor deposition, or atomic layer deposition, and may comprise dielectric materials such as oxides, nitrides, oxynitrides, oxycarbides or combinations thereof, and the layer for forming the conductive material of the gate electrodes 106 can be formed by a process such as chemical vapor deposition, physical vapor deposition, atomic layer deposition, sputtering, and electroplating, and may comprise conductive materials such as doped polysilicon materials, metal, or combinations thereof.

Figure 3:
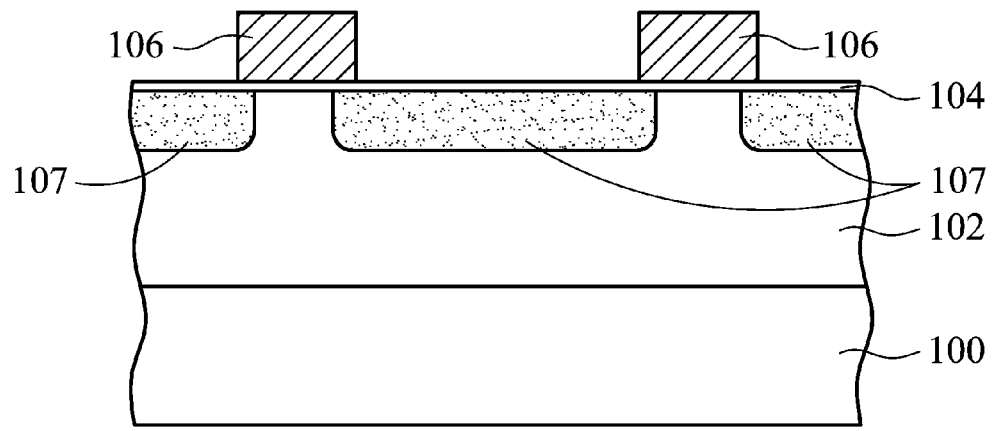

In FIG. 3, a well region 107 having a second conductivity type is formed in a portion of the epitaxial layer 102 and is substantially underlying a portion of the gate electrode 106. The well region 107 can be formed by an implanting process. The well region 107 is isolated from another well region 107 by the epitaxial layer 102. The well region 107 can be, for example, a P type well region.

Figure 4:
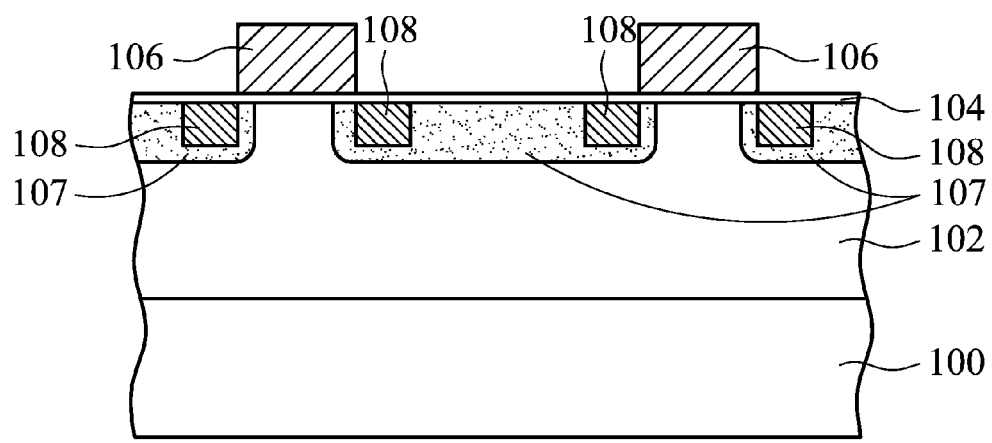

In FIG. 4, a doping region 108 having the first conductivity type is formed in a portion of the well region 107 in the epitaxial layer 102 and is respectively adjacent to opposite sides of the gate electrode 106. The doping regions 108 can be formed by an implanting process using a patterned photoresist layer (both not shown) as an implant mask. The doping region 108 is isolated from another doping region 108 by the epitaxial layer 102, and a doping concentration in the doping region 108 higher than that in the epitaxial layer 102. Thus, the doping region 108 can be, for example, a heavily doped N type (N+) region.

Figure 5:
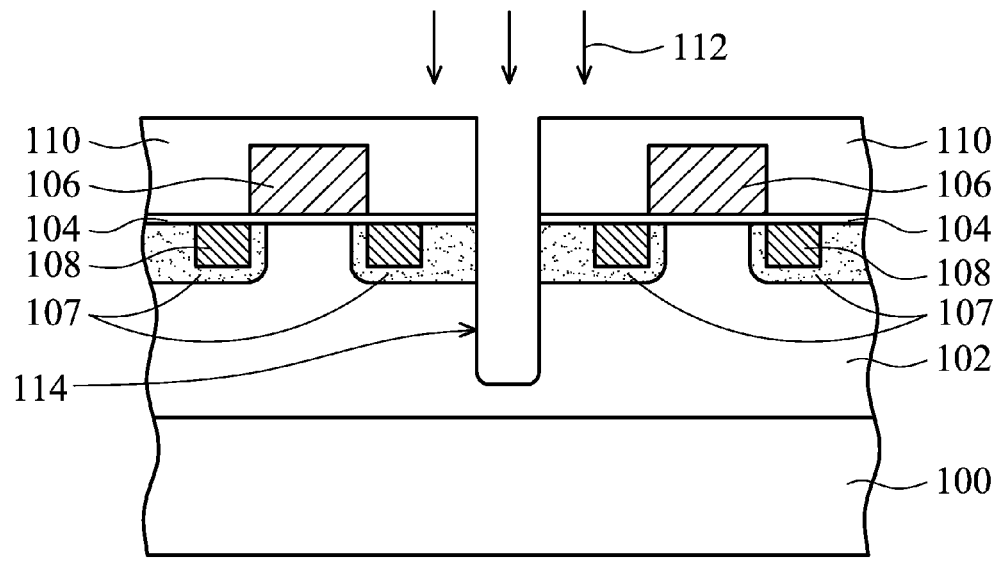

In FIG. 5, an inter layer dielectric (ILD) 110 is blanketly formed over the gate dielectric layer 104, covering the gate electrodes 106. In one embodiment, the inter layer dielectric (ILD) 110 can be formed by a process such as chemical vapor deposition, or spin coating, and may comprise dielectric materials such as oxides, or spin-on glass materials. Next, an etching process 112 is performed, using a patterned photoresist layer (not shown) as an etching mask, to remove a portion of the inter layer dielectric (ILD) 110, the gate dielectric layer 104, and the epitaxial layer 102 between two adjacent gate electrodes 106, thereby forming an opening 114 in a portion of the inter layer dielectric (ILD) 110, the gate dielectric layer 104, and the epitaxial layer 102 between the two adjacent gate electrodes 106. A liner oxide layer (not shown) may optionally be formed on sidewalls of the portions of the epitaxial layer 102 exposed by the opening 114 through a method such as thermal oxidation.

Figure 6:
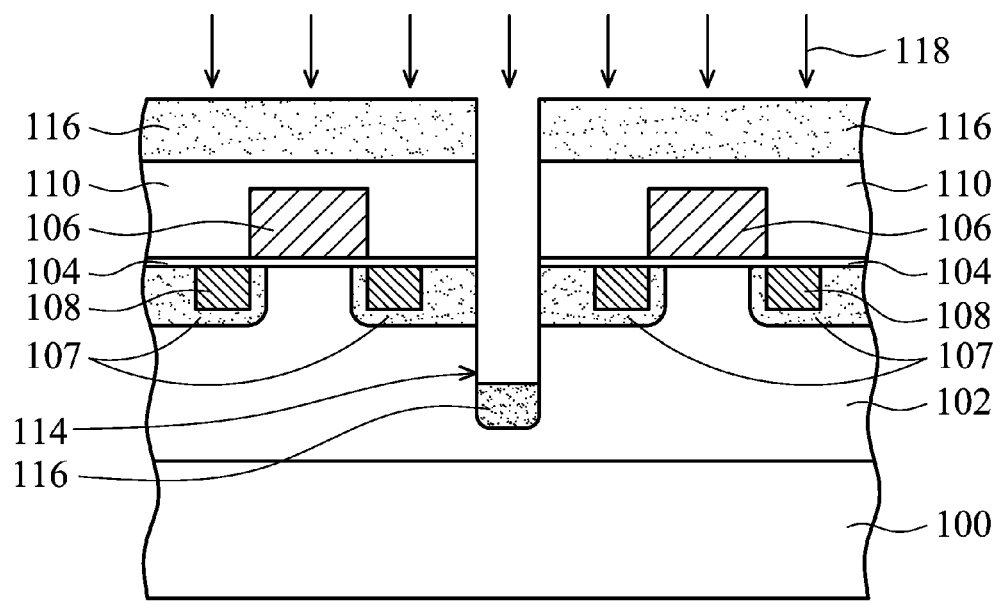

In FIG. 6, a layer of undoped polysilicon 116 material (not shown) is blanketly deposited over the inter layer dielectric (ILD) 110 and filled into the opening 114. Next, an etching process (not shown) is performed to etch back the layer of polysilicon material, thereby leaving an undoped polysilicon layer 116 in a lower portion of the opening 114 and on the inter layer dielectric (ILD) 110. Next, an implant process 118 is performed to implant dopants having a second conductivity type into the undoped polysilicon layer 116. In one embodiment, the dopants having the second conductivity type can be, for example, P type dopants such as boron ions. The undoped polysilicon layer 116 formed on the inter layer dielectric (ILD) 110 is then removed after the implant process 118, such that only a doped polysilicon layer 116a (see FIG. 7) is remained in the opening 114.

Figure 7:
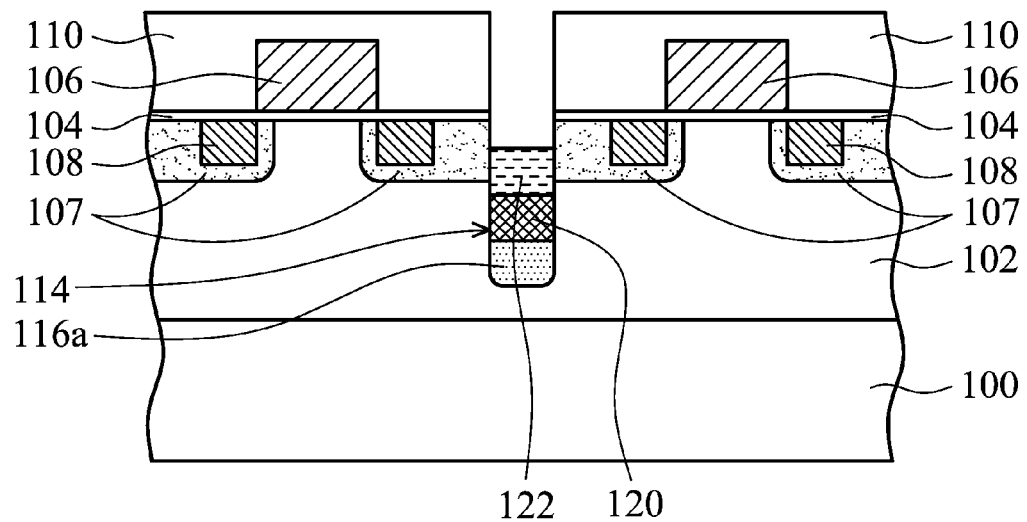

In FIG. 7, the fabrication steps directed to FIG. 6 are repeated for two more times to form another two doped polysilicon layers 120 and 122 in the opening 114, and a top surface of the doped polysilicon layer 122 is substantially near a top surface of the epitaxial layer 102. The doped polysilicon layers 120 and 122 are also doped by an implant process such as an implant process 118 shown in FIG. 6 with dopants having the second conductivity type, and doping concentrations in the doped polysilicon layers 120 and 122 may be the same with or different from that in the doped polysilicon layer 116a.

Figure 8:
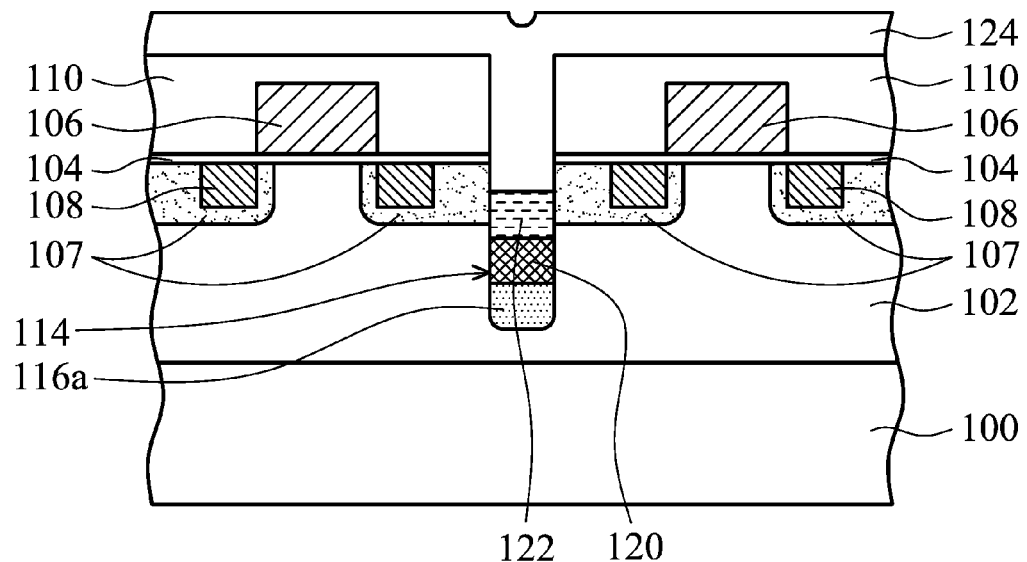

In FIG. 8, an insulating layer 124 is blanketly formed over the inter layer dielectric (ILD) 110 and fills the opening 114. The insulating layer 124 may be formed by a method such as chemical vapor deposition (CVD), or spin-coating, and may comprise insulating materials such as oxides, nitrides, or spin-on glass.

Figure 9:
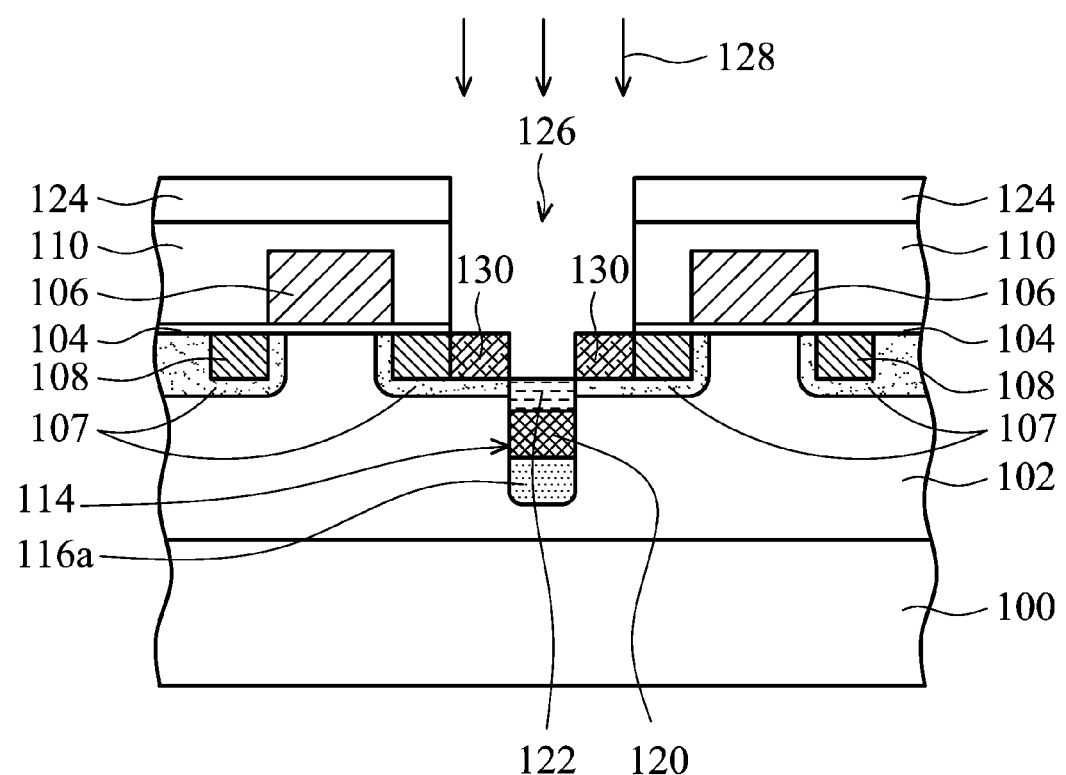

In FIG. 9, an etching process (not shown) is performed to remove a portion of the insulating layer 124 and the inter layer dielectric (ILD) 110 between the two adjacent gate electrodes 106 by use of a patterned photoresist layer (not shown) as an etching mask, thereby forming an opening 126 in the insulating layer 124 and the inter layer dielectric (ILD) 110. The opening 126 exposes a portion of the well regions 107 and the doped polysilicon layer 122 between the two adjacent gate electrodes 106 and is adjacent to the doping regions 108. An implant process 128 is then performed to implant dopants having the second conductive type in the portion of the epitaxial layer 102 exposed by the opening 126, thereby forming a doping region 130 in the epitaxy layer 102. The doping concentrations in the doping region 130 higher than that in the well region 107. Thus, the doping region 130 can be, for example, a heavily doped P type (P+) region, and the well region 107 can be, for example, a lightly doped P type (P−) region.

Figure 10:
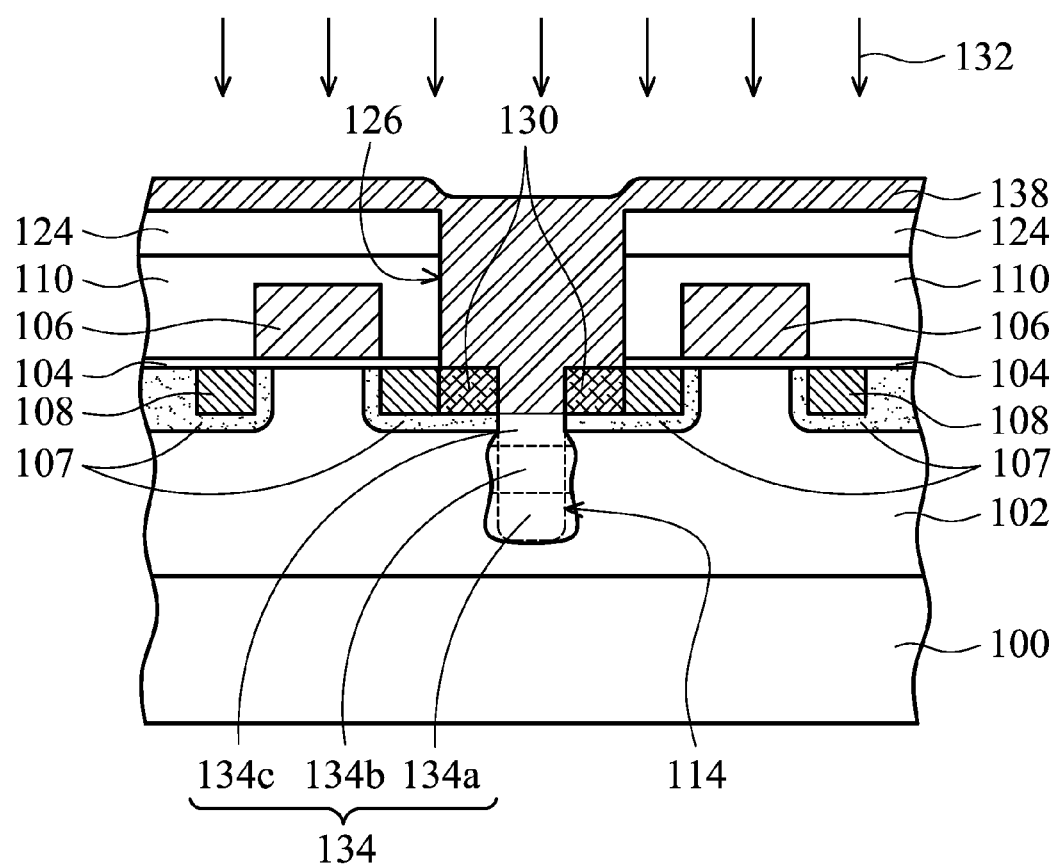

In FIG. 10, a thermal process 132 is performed to diffuse the dopants in the doped polysilicon layers 122, 120, and 116. In one embodiment, the thermal process 132 can be, for example, a rapid thermal annealing (RTA) process, and a process time and a process temperature of the thermal process 132 may depend on the doping concentrations and the thickness of the doped polysilicon layers 122, 120, and 116a. After the thermal process 132, a doping region 134 having the second conductivity type is formed the epitaxial layer 102. The doping region 134 comprises a plurality sub-regions 134a, 134b, and 134c sequentially stacked over the epitaxial layer 102 from a bottom to a top of the opening 114, and the sub-regions 134a, 134b, and 134c respectively comprises one the doped polysilicon layer 116a, 120, and 122 (See FIG. 9). A width or a diameter of the formed sub-regions 134a, 134b, and 134c of the doping region 134 may be the same or different from each other, and can be controlled by the doping concentrations and the thickness in the doped polysilicon layer 116a, 120, and 122, respectively. The number of sub-regions for forming the doping region 134 and configurations thereof are not limited by that illustrated in FIG. 10. In one embodiment, the doping region 134 may comprise only one sub-region (not shown). Next, a conductive layer 138 is blanketly formed over the insulating layer 124 to fill the opening 126, thereby forming a conductive element which physically contacts with the doping region 130 and doping region 108. An interface between the doping region 130 and the doping region 108 adjacent thereto may function as a source of the semiconductor device, and the semiconductor substrate 100 may function as a drain of the semiconductor device, such that the semiconductor device comprising the doping region 134 may function as a super junction structure of a semiconductor device.

The exemplary method for fabricating a semiconductor device with a super-junction structure illustrated in FIGS. 1-10 is an example for forming an N-type VDMOSFET. However, in other embodiments, the first conductive type can be, for example, a P-type conductivity, and the second conductive type, can be, for example, an N-type conductivity, such that a P-type VDMOSFET can also be fabricated by the exemplary method illustrated in FIGS. 1-10.

In one embodiment, an exemplary semiconductor device, such as a VDMOSFET, with a super-junction structure is provided. The exemplary semiconductor device with the super-junction structure comprises: a semiconductor substrate (e.g. the semiconductor substrate 100) having a first conductivity type; an epitaxial layer (the epitaxial layer 102) having the first conductivity type formed over the semiconductor substrate; a first doping region (e.g. one of the doping regions 108 formed between the doping region 134 and the gate electrode 106) having the first conductive type formed in a portion of the epitaxial layer; a second doping region (e.g. the doping region 130) having a second conductivity type formed in a portion of the of the epitaxial layer; a third doping region (e.g. the doping region 134) having the second conductivity type formed in a portion of the of the epitaxial layer, wherein the third doping region partially comprises doped polysilicon materials having the second conductivity type; a gate dielectric layer (e.g. the gate dielectric layer 104) formed over the epitaxial layer, partially overlying the well region; and a gate electrode (e.g. one of the gate electrodes 106) formed over a portion of the gate dielectric layer.

Since fabrication of the super-junction structure in the semiconductor device do not contain any epitaxy-related fabrication steps, fabrication time and costs can be reduced when compared with the super-junction structure fabricated by the conventional multi-epi technology. The exemplary super-junction structure shown in FIG. 10 may achieve charge balances by adjusting doping concentrations and energies for forming the N-type and P-type regions in the epitaxial layer 102. Doping concentrations and energies of the N-type and P-type regions formed in the epitaxial layer 102 depend on designs of the semiconductor device using the same. In addition, the semiconductor device comprising the exemplary super-junction structure shown in FIG. 10 can be also formed with a reduced size when compared with the semiconductor device comprising a super-junction structure fabricated by the conventional multi-epi technology.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A method for fabricating a semiconductor device with a super-junction structure, comprising the following steps:
    (a) providing a semiconductor substrate having a first conductivity type;
    (b) forming an epitaxial layer having the first conductivity type over the semiconductor substrate;
    (c) forming a gate dielectric layer over the epitaxial layer;
    (d) forming a gate electrode over a portion of the gate dielectric layer;
    (e) forming a first doping region having the first conductive type in a portion of the epitaxial layer;
    (f) forming an opening in a portion of the gate dielectric layer and the epitaxial layer;
    (g) forming an undoped polysilicon layer in the opening;
    (h) performing an implanting process, implanting dopants of a second conductivity type in the undoped polysilicon layer, thereby forming a doped polysilicon layer having the second conductivity type in the opening;
    (i) forming a second doping region having a second conductive type in a portion of the epitaxial layer adjacent to the first doping region and the opening; and
    (j) performing a thermal process to diffuse the dopants in the doped polysilicon layer into the epitaxial layer adjacent thereto, thereby forming a third doping region having the second conductivity type in the epitaxial layer.

2. The method as claimed in claim 1, prior to the step (i), further comprising performing the steps (g) and (h) for at least one more time to form at least an additional doped polysilicon layer in the opening.

3. The method as claimed in claim 2, wherein, after the step (i) is performed, a plurality of stacked doping regions having the second conductivity type are formed in the opening in the epitaxial layer.

4. The method as claimed in claim 1, wherein the first conductivity type is N-type, and the second conductivity type is P-type.

5. The method as claimed in claim 1, wherein a doping concentration in the semiconductor substrate is greater than that in the epitaxial layer.

6. The method as claimed in claim 1, wherein a doping concentration in the first doping region is greater than that in the epitaxial layer.

7. The method as claimed in claim 1, wherein the semiconductor substrate functions as a drain, an interface between the first and second doping regions functions as a source, and the semiconductor device is a vertical double diffused metal-oxide-semiconductor field effect transistor.

8. The method as claimed in claim 1, wherein a width or a diameter of the doping region is determined by a doping concentration and a thickness of the doped polysilicon materials having the second conductive type.

9. A method for fabricating a super-junction structure, comprising the following steps:
    (a) providing a semiconductor substrate having a first conductivity type;
    (b) forming an epitaxial layer having the first conductivity type over the semiconductor substrate;
    (c) forming an opening in a portion of the epitaxial layer;
    (d) forming a polysilicon layer having a second conductivity type in the opening;
    (e) performing an implanting process, implanting dopants of the second conductivity type in the polysilicon layer, thereby forming a doped polysilicon layer having the second conductivity type in the opening; and
    (f) performing a thermal process to diffuse the dopants in the doped polysilicon layer into the epitaxial layer adjacent thereto, thereby forming a doping region having the second conductivity type in the epitaxial layer.

10. The method as claimed in claim 9, prior to the step (f), further comprising performing the steps (d) and (e) for at least one more time to form at least an additional doped polysilicon layer in the opening.

11. The method as claimed in claim 10, wherein, after the step (i) is performed, a plurality of stacked doping regions having the second conductivity type are formed in the epitaxial layer.

12. The method as claimed in claim 9, wherein the first conductivity type is N-type, and the second conductivity type is P-type.

13. The method as claimed in claim 9, wherein a width or a diameter of the doping region is determined by a doping concentration and a thickness of the doped polysilicon materials having the second conductive type.

* * * * *